(12) United States Patent
Frimberger et al.

(10) Patent No.: US 12,392,836 B2
(45) Date of Patent: Aug. 19, 2025

(54) BATTERY SENSOR

(71) Applicant: Continental Automotive GmbH, Hannover (DE)

(72) Inventors: Manfred Frimberger, Ergoldsbach (DE); Alexander Kalbeck, Burglengenfeld (DE); Martin Schramme, Königsbrunn (DE); Karlheinz Warnke, Obertraubling (DE)

(73) Assignee: Continental Automotive Technologies GmbH, Hannover (DE)

( * ) Notice: Subject to any disclaimer, the term of this patent is extended or adjusted under 35 U.S.C. 154(b) by 313 days.

(21) Appl. No.: 17/633,580

(22) PCT Filed: Sep. 9, 2020

(86) PCT No.: PCT/EP2020/075240
§ 371 (c)(1),
(2) Date: Feb. 8, 2022

(87) PCT Pub. No.: WO2021/048232
PCT Pub. Date: Mar. 18, 2021

(65) Prior Publication Data
US 2022/0308116 A1  Sep. 29, 2022

(30) Foreign Application Priority Data
Sep. 11, 2019  (DE) ............ 10 2019 213 885.3

(51) Int. Cl.
*G01R 31/388*  (2019.01)
*G01R 19/00*   (2006.01)
(Continued)

(52) U.S. Cl.
CPC ....... *G01R 31/388* (2019.01); *G01R 19/0038* (2013.01); *G01R 19/16542* (2013.01); *G01R 31/389* (2019.01); *H01M 10/486* (2013.01)

(58) Field of Classification Search
CPC .......... G01R 19/0038; G01R 19/16542; G01R 31/388; G01R 31/389; H01M 10/486
(Continued)

(56) References Cited

U.S. PATENT DOCUMENTS 11,287,482 B2 *  3/2022  Koerner ............ G01R 31/3842
11,467,219 B2 * 10/2022  Matsukawa ............ H02J 7/005
(Continued)

FOREIGN PATENT DOCUMENTS

DE        10131765 A1   1/2003
DE     102004022556 B3   10/2005
(Continued)

OTHER PUBLICATIONS

German Search Report dated Oct. 9, 2020 for the counterpart German Patent Application No. 10 2019 213 855.3.
(Continued)

*Primary Examiner* — Lisa M Caputo
*Assistant Examiner* — Joshua L Forristall

(57) ABSTRACT

A battery sensor for sensing at least one battery parameter including at least two measuring units. The measuring units each include at least one sensing device for sensing at least one measured value and at least one evaluation circuit for determining at least one battery parameter from the respectively sensed at least one measured value. An evaluation unit is provided, which compares the battery parameters determined by the evaluation circuits, and outputs an error signal in the event that a defined difference between the battery parameters is exceeded.

8 Claims, 1 Drawing Sheet

(51) Int. Cl.
  *G01R 19/165* (2006.01)
  *G01R 31/389* (2019.01)
  *H01M 10/48* (2006.01)

(58) Field of Classification Search
  USPC .......................................................... 702/63
  See application file for complete search history.

(56) References Cited

U.S. PATENT DOCUMENTS

| | | | |
|---|---|---|---|
| 11,789,089 B2* | 10/2023 | Kim .................. | G01R 31/3835 |
| | | | 324/432 |
| 2005/0248351 A1 | 11/2005 | Graf | |
| 2012/0319473 A1* | 12/2012 | Tzivanopoulos ...... | G01R 15/20 |
| | | | 324/252 |
| 2013/0181720 A1 | 7/2013 | Bremmer | |
| 2013/0257444 A1* | 10/2013 | Boehm .............. | G01R 31/3842 |
| | | | 324/434 |
| 2016/0211684 A1* | 7/2016 | Tsurumaru ............ | H01M 10/44 |
| 2017/0207496 A1 | 7/2017 | Bergmann | |
| 2020/0343600 A1* | 10/2020 | Song ................. | H01M 10/6563 |
| 2020/0386823 A1* | 12/2020 | Lee ......................... | G01R 35/00 |
| 2022/0009377 A1* | 1/2022 | Imanaka ................. | B60L 58/25 |
| 2022/0299558 A1* | 9/2022 | Choi .................. | G01R 31/3835 |

FOREIGN PATENT DOCUMENTS

| | | |
|---|---|---|
| DE | 102012205401 A1 | 10/2013 |
| DE | 102014202622 A1 | 8/2015 |
| DE | 102017223535 A1 | 6/2019 |
| EP | 2623994 A1 | 8/2013 |
| EP | 2623996 A1 | 8/2013 |
| KR | 20160059204 A | 5/2016 |
| WO | 2016008649 A1 | 1/2016 |

OTHER PUBLICATIONS

The International Search Report and the Written Opinion of the International Searching Authority mailed on Dec. 23, 2020 for the counterpart PCT Application No. PCT/EP2020/075240.

Chinese Office Action dated Nov. 28, 2024 for the counterpart Chinese Patent Application No. 202080059973.6 and machine translation of same.

Second Office Action mailed on May 28, 2025 for the counterpart Chinese Patent Application No. 202080059973 and machine translation of same.

* cited by examiner

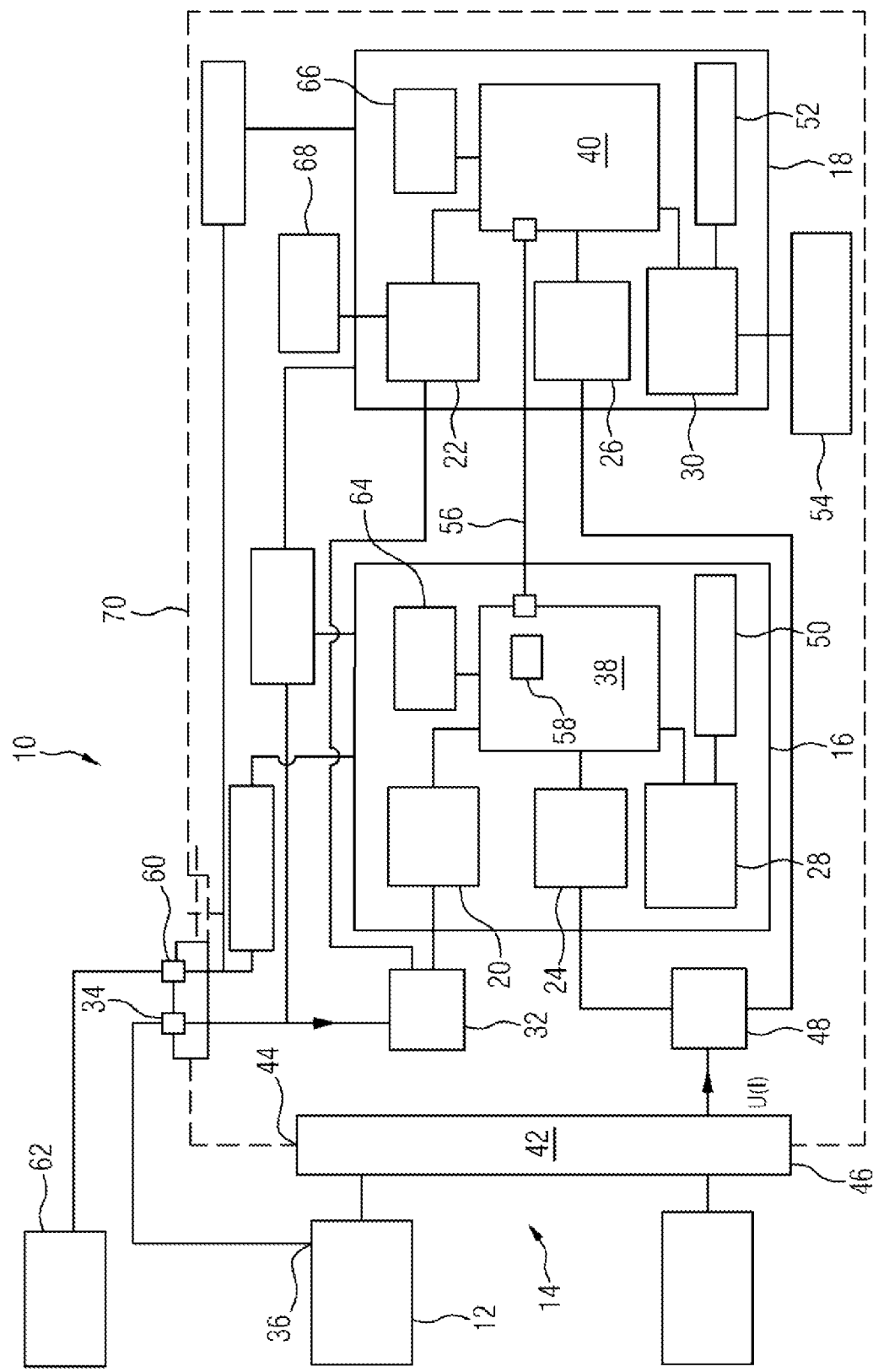

BATTERY SENSOR

CROSS-REFERENCE TO RELATED APPLICATIONS

This application is a National Stage Application under 35 U.S.C. § 371 of International Application No. PCT/EP2020/075240 filed on Sep. 9, 2020, which claims priority from German Patent Application No. 102019213885.3 filed on Sep. 11, 2019, in the German Patent and Trade Mark Office, the disclosures of which are herein incorporated by reference in their entireties.

BACKGROUND

1. Field

Embodiments of the present application relate to a battery sensor for sensing at least one battery parameter.

2. Description of Related Art

Battery sensors are used in vehicles to sense battery parameters, for example the battery current or the battery voltage of the vehicle battery. Such a battery sensor comprises, for example, a measurement segment arranged in the current path and along which measured values are sensed, from which a battery parameter can be determined.

The battery sensor must have high accuracy over the entire service life in order to be able to ascertain the battery condition as accurately as possible. It must also be ensured that errors in ascertaining the battery parameters, in particular in ascertaining the battery voltage or the battery current, are detected and/or prevented with a high degree of reliability.

It is known from the prior art, for example, to provide fully redundant measurement of the battery parameters. This involves an extremely costly design, however, because two completely separate measurement paths must be constructed, for instance containing two completely separate battery sensors. Such a construction also needs a very large amount of space.

SUMMARY

An object of embodiments of the present application is to provide a battery sensor which can detect and/or prevent errors in the measurement of the battery parameters with a very high degree of reliability, and which has a very compact construction.

In order to achieve the object, a battery sensor for sensing at least one battery parameter is provided, having at least two measuring units, wherein the measuring units each comprise at least one sensing device for sensing at least one measured value. The measuring units each comprise at least one evaluation circuit for determining at least one battery parameter from the respectively sensed at least one measured value. At least one evaluation unit is provided, which compares the battery parameters determined by the evaluation circuits, and outputs an error signal in the event that a defined difference between the battery parameters is exceeded.

The battery sensor therefore has two measuring units that work independently of one another, each determining the same battery parameter(s). The battery parameters determined by both measuring units are compared with each other, preferably inside the battery sensor. Since both measuring units sense the same measured values, the determined battery parameters must match, or may differ from one another only by a defined value. If this difference is exceeded, an error signal is output. Thus, inside the battery sensor are provided at least two measurement segments for one battery parameter, which measurement segments can be compared with one another. The fact that the measurement segments refer to the same measured values ensures that, given correct operation, they determine identical battery parameters or battery parameters that differ from one another only slightly. For example, the measuring units can also have shared contacts for sensing the measured values. This can reduce the number of contacts and also ensure that the measuring units sense the same measured values. Differences in the determined battery parameters must therefore be caused by errors within the measuring units, and therefore it is possible to localize the error source.

In order to make the battery sensor as compact as possible, an evaluation unit can be integrated in at least one evaluation circuit, wherein the evaluation circuits are connected to each other by a signal line, via which the battery parameters are transferred to the evaluation unit. This means that there is no need for an additional circuit in order to compare the battery parameters with each other. This is done in one of the measuring units. In order to further increase the accuracy, evaluation units can also be present in a plurality of measuring units, in which case their values can likewise be compared with each other.

The evaluation unit can also be provided in a higher-level controller, for instance a vehicle controller, allowing a smaller design for the battery sensor.

In addition, it is possible to provide in at least one measuring unit a diagnostics unit for performing a self-test of the measurement unit and/or of at least one sensing device. The particular measuring unit can perform a self-diagnosis or calibration. This can further increase the reliability and/or the accuracy of the battery sensor. The self-diagnosis can additionally detect errors inside the particular measuring unit, whereby error detection is even possible when both measuring units have an error that might lead to the output of identical or similar battery parameters. In addition, by virtue of the calibration, it is also possible to increase the accuracy of the particular measuring unit, so that additionally the measurement accuracy of the entire battery sensor can be increased.

The measuring units may differ in terms of construction and/or in the manner of determining the battery parameters. It is thereby possible that systemic errors that might apply to both measuring units, to detect identical errors in both measuring units, for instance having the same root cause. For example, each one of the measuring units can comprise additional elements for improving the accuracy or for calibrating the measuring unit.

For example, a filter for the measured value can be connected in front of at least one sensing device of a measuring unit. In particular, it is also possible to provide a shared filter for corresponding sensing devices of a plurality of measuring units.

The measured values may also be dependent on temperature, for example. In order to increase the measurement accuracy, the measuring units can each comprise a temperature-sensing circuit, in particular having a temperature sensor arranged inside the measuring unit, wherein the determined temperature is output to the evaluation circuit. The battery parameter is determined from the respectively sensed first measured value, from the respectively sensed second measured value and from the determined temperature. For example, the measurement segment can comprise a resistive element, and the measuring unit senses a voltage drop along the measurement segment or the resistive element. The battery current, for example, can be determined from the sensed voltage drop and from the known electrical resistance of the resistive element. Since the electrical resistance of the resistive element can vary as a function of the temperature, it is necessary to sense the temperature in order to determine the exact electrical resistance of the resistive element.

At least one temperature-sensing circuit can be connected to a temperature sensor arranged outside the measuring unit. This temperature-sensing circuit can use the external temperature sensor to check the temperature sensing by the internal temperature sensor, so that it is possible either to calibrate the internal temperature sensor or to detect malfunctioning thereof. The external temperature sensor can be arranged, for example, on a shared circuit board of the battery sensor or entirely outside the battery sensor.

In addition, at least one measuring unit can comprise a reference circuit for providing a reference signal. The reference signal has a known magnitude. It is also known which battery parameter, or what change in the battery parameter, is produced by the reference signal. The associated measuring unit can be calibrated by the reference signal. Alternatively, the battery parameter of the relevant measuring unit can additionally contain the reference signal. In the evaluation unit, it is possible, for instance, to filter out the reference signal or to check the change in the battery parameter caused by the reference signal, whereby it is equally possible to compare the battery parameters with each other.

The measuring units are preferably arranged on a shared circuit board in order for the battery sensor to be as compact as possible. In particular, the measuring units may be arranged on opposite faces of the circuit board in order to reduce the size of the circuit board.

The measuring units can also comprise a plurality of sensing devices, wherein the same battery parameters are sensed respectively.

A first sensing device may be, for example, a voltage-sensing device for sensing the battery voltage, wherein the first sensing device comprises in particular a first contact for making contact with a battery pole of the vehicle battery.

A second sensing device may be a current-sensing device for sensing the battery current.

The current-sensing device can comprise a measurement segment, wherein a first measured value is sensed at a first contact at a first end of the measurement segment, and a second measured value is sensed at a second contact at a second end of the measurement segment.

The measurement segment comprises, for example, at least one measurement resistor of defined electrical resistance, and the measured values are each voltages. Hence each of the measuring units senses the voltage drop along the measurement segment. Using the known electrical resistance of the measurement resistor, it is possible to determine from the respectively determined voltage drop, the battery current flowing via the battery sensor can be improved the measurement segment.

BRIEF DESCRIPTION OF THE DRAWINGS

Further advantages and features will be apparent when taken in conjunction with the following drawing:

FIG. 1 is a block diagram illustrating a schematic design of a battery sensor according to an embodiment.

DETAILED DESCRIPTION

FIG. 1 shows a battery sensor 10 for sensing battery parameters of a vehicle battery 12, which is arranged in a circuit 14 in a motor vehicle.

The battery sensor 10 comprises two measuring units 16, 18, which each comprise a plurality of sensing devices for sensing at least one battery parameter, wherein both measuring units 16, 18 sense the same battery parameters. A first sensing device of the measuring units is a voltage-sensing device 20, 22 respectively for sensing the battery voltage; a second sensing device is a current-sensing device 24, 26 respectively for sensing the battery current. In addition, each measuring unit 16, 18 comprises a temperature-sensing device 28, 30.

The voltage-sensing devices 20, 22 are connected via a shared filter 32 to an input 34 of the battery sensor 10. The input 34 is electrically connected to a battery pole 36, so that the voltage-sensing devices 20, 22 receive and output the same measured value to an evaluation circuit 38, 40, which determines from this measured value the battery voltage of the vehicle battery 12.

The current-sensing devices 24, 26 comprise a shared measurement segment 42, which is arranged in the load current path and is formed by a measurement resistor having a defined electrical resistance. The measurement resistor can be formed by a plurality of resistive elements arranged in series and/or in parallel. The first measured value is a voltage sensed at a first end of the measurement segment; a second measured value is a voltage sensed at a second end of the measurement segment. In each evaluation circuit 38, 40, the voltage drop across the measurement segment 42, i.e. across the measurement resistor, can be calculated from these voltages, and can be used, together with the known electrical resistance of the measurement resistor, to determine the current flowing via the measurement segment, i.e. the battery current. The fact that both measuring units 16, 18 use a shared measurement segment ensures that they receive the same measured values 42, and thus, given correct operation of the measuring units 16, 18, must output the same battery parameters. A shared filter 48 is also provided in front of the current-sensing devices 24, 26.

The temperature-sensing circuit 28 of the first measuring unit 16 comprises an internal temperature sensor 50, the signal from which is likewise output to the evaluation circuit 38. The temperature signal can be used, for example, to correct or improve the measurements from the current-sensing device 20 or the voltage-sensing device 24. The temperature-sensing circuit 30 of the second measuring unit 18 similarly comprises an internal temperature sensor 52. In addition, the temperature-sensing circuit 30 comprises a second, external temperature sensor 54. This makes it possible, for example, to check the internal temperature sensor 52 or to sense additional temperature data, for instance in order to improve the measurement by the battery sensor 10.

A signal line 56 is provided between the evaluation circuits 38, 40, via which the determined battery parameters can be output to the other evaluation circuit 38, 40 respectively. An evaluation unit 58 is additionally provided in the evaluation circuit 38 of the first measuring unit 16. The evaluation unit 58 compares the battery parameters from the evaluation circuit 38 with the battery parameters from the evaluation circuit 40. Since these each arise on the same measured values, they should be identical or may exhibit only slight differences. If the difference between the corresponding battery parameters from the evaluation circuits 38, 40 exceeds, an error signal is output, in particular via the output 60, to a higher-level controller 62 in order to indicate a malfunction of the battery sensor 10.

The battery parameters determined by both measuring units 16, 18 are thus checked inside the battery sensor 10, wherein the battery parameters relate respectively to the same measured values. The error sources can thus be reduced to the sensing devices 20, 22, 24, 26, 28, 30 and/or the evaluation circuits 38, 40. Since the sensing devices 20, 22, 24, 26, 28, 30 each use the same measured values, the number of contacts to the circuit 14 or to the vehicle battery 12 can be reduced. Hence a redundant measurement of the battery parameters is performed, and error-checking is carried out inside the battery sensor. The battery sensor is thus very reliable and has only a small overall size, because there is no need for separate contacts and/or measurement segments for both measurement paths.

In addition, each of the measuring units 16, 18 comprises a diagnostics unit 64, 66 in order to perform a self-diagnosis. The diagnostics units 64, 66 can be used, for example, for testing or calibrating the sensing devices 20, 22, 24, 26, 28, 30, in particular at regular intervals, during routine operation, and/or for testing the sensing devices 20, 22, 24, 26, 28, 30 or the entire measuring units 16, 18 after the output of an error signal.

In the embodiment shown here, the measuring units 16, 18 have substantially the same construction, i.e. the corresponding sensing devices 20, 22, 24, 26, 28, 30 have the same construction or are based on the same measurement technique. It is also possible, however, that these use the same measured values but different evaluation methods in order to avoid systemic error sources. In particular, additional elements, for instance filters, temperature sensors or calibration devices, can be provided in the individual measuring units 16, 18 in order to be able to detect shared measurement errors in the measuring units 14, 18, for instance from a shared root cause.

In the embodiment shown of the battery sensor 10, a reference-voltage source 68 for the voltage-sensing devices 22 is provided, for example, which can apply a defined voltage of known magnitude to the voltage-sensing devices 22, for instance to test or calibrate said devices. In addition, an external temperature sensor 54 is provided at the temperature-sensing circuit 30 in order to calibrate this circuit or to be able to provide the evaluation circuit 40 with an additional temperature value. Further elements may be, for example, filters 32, 48, which filter only the measured values of one of the two measuring units 16, 18.

In the embodiment shown here, the measuring units 16, 18 are arranged, in particular adjacently, on a shared circuit board 70. The measuring units 16, 18 are preferably arranged on opposite sides of the circuit board 70 in order to be able to make the circuit board smaller.

Optionally, the evaluation unit 48 can also be arranged outside the measuring units 16, 18, in particular also outside the battery sensor 10.

The invention claimed is:

1. A battery sensor for a battery comprising:
   a first measuring unit, the first measuring unit comprising:
      a first voltage-sensing device coupled to an input of the battery sensor configured to be connected to a pole of the battery, the first voltage-sensing device configured to sense a first measured value of a voltage the battery;
      a first current-sensing device coupled to a first end and a second end of a shared measurement segment arranged in a current path of the battery, the first current-sensing device configured to sense a first voltage drop across the shared measurement segment; and
      a first evaluation circuit configured to determine a first voltage of the battery from the first measured value and configured to determine a first current of the battery flowing through the shared measurement segment based on the first voltage drop;
   a second measuring unit, the second measuring unit comprising:
      a second voltage-sensing device coupled to the input of the battery sensor, the second voltage-sensing device configured to sense a second measured value of the voltage of the battery;
      a second current-sensing device coupled to the first end and the second end of the shared measurement segment, the second current-sensing device configured to sense a second voltage drop across the shared measurement segment; and
      a second evaluation circuit configured to determine a second voltage of the battery from the second measured value and configured to determine a second current of the battery flowing through the shared measurement segment based on the second voltage drop;
   an evaluation unit configured to compare the first voltage of the battery and the second voltage of the battery, compare the first current of the battery and the second current of the battery, and output an error signal based on a first difference between the first voltage of the battery and the second voltage of the battery exceeding a first threshold or a second difference between the first current of the battery and the second current of the battery exceeding a second threshold;
   a first filter connected to a first input of the first voltage-sensing device and a second input of the second voltage-sensing device; and
   a second filter connected to a first input of the first current-sensing device and a second input of the second current-sensing device.

2. The battery sensor as claimed in claim 1, wherein the evaluation unit is integrated in the first evaluation circuit or the second evaluation circuit, and
   wherein the first evaluation circuit and the second evaluation circuit are connected to each other by a signal line, via which signals are transferred between the first evaluation circuit and the second evaluation circuit to the evaluation unit.

3. The battery sensor as claimed in claim 1, wherein the first measuring unit comprises a first diagnostics unit configured to perform a self-test of the first measuring unit, and
   wherein the second measuring unit comprises a second diagnostics unit configured to perform a self-test of the second measuring unit.

4. The battery sensor as claimed in claim 1, wherein the first measuring unit comprises a first temperature-sensing circuit comprising a first temperature sensor configured to output a first temperature to the first evaluation circuit,
   wherein the second measuring unit comprises a second temperature-sensing circuit comprising a second temperature sensor configured to output a second temperature to the second evaluation circuit, wherein the first evaluation unit is configured to determine at least one of the first voltage of the battery and the first current of the battery based on the first temperature, and wherein the second evaluation unit is configured to determine at least one of the second voltage of the battery and the second current of the battery based on the second temperature.

5. The battery sensor as claimed in claim 4, wherein the first temperature-sensing circuit and the second temperature-sensing circuit are connected to a temperature sensor arranged external to the first measuring unit and the second measuring unit.

6. The battery sensor as claimed in claim 1, wherein the first measuring unit comprises a first reference circuit configured to output a first reference signal, and wherein the second measuring unit comprises a second reference circuit configured to output a second reference signal.

7. The battery sensor as claimed in claim 1, wherein the first measuring unit and the second measuring unit are arranged on opposing faces of a shared circuit board.

8. The battery sensor as claimed in claim 1, wherein the shared measurement segment comprises at least one measurement resistor of defined electrical resistance.

\* \* \* \* \*